United States Patent
Lee et al.

(10) Patent No.: US 9,490,446 B2
(45) Date of Patent: Nov. 8, 2016

(54) ORGANIC LIGHT-EMITTING DIODE DISPLAY WITH SPLIT ANODES

(71) Applicant: Apple Inc., Cupertino, CA (US)

(72) Inventors: Jungmin Lee, Cupertino, CA (US); ChoongHo Lee, Cupertino, CA (US); Jinkwang Kim, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/498,844

(22) Filed: Sep. 26, 2014

(65) Prior Publication Data

US 2015/0364712 A1     Dec. 17, 2015

Related U.S. Application Data

(60) Provisional application No. 62/012,907, filed on Jun. 16, 2014.

(51) Int. Cl.
| | |
|---|---|
| *H01L 51/52* | (2006.01) |
| *H01L 33/36* | (2010.01) |
| *H01L 33/38* | (2010.01) |
| H01L 27/32 | (2006.01) |

(52) U.S. Cl.
CPC ....... *H01L 51/5209* (2013.01); *H01L 27/3218* (2013.01); *H01L 33/36* (2013.01); *H01L 33/38* (2013.01); *H01L 27/3211* (2013.01); *H01L 27/3213* (2013.01); *H01L 27/3216* (2013.01); *H01L 27/3246* (2013.01)

(58) Field of Classification Search
CPC ... H01L 33/36; H01L 33/38; H01L 27/3211; H01L 27/3246; H01L 27/3283; H01L 27/3295
See application file for complete search history.

(56) References Cited

U.S. PATENT DOCUMENTS

| | | |
|---|---|---|
| 8,338,832 B2 | 12/2012 | Kim |
| 8,441,420 B2 | 5/2013 | Kim et al. |
| 8,598,784 B2 | 12/2013 | Ko |
| 8,680,518 B2 | 3/2014 | Kim et al. |
| 8,994,616 B2 | 3/2015 | Umetsu et al. |
| 2014/0197385 A1* | 7/2014 | Madigan ................ H01L 51/56 257/40 |

\* cited by examiner

*Primary Examiner* — Yu-Hsi D Dun
(74) *Attorney, Agent, or Firm* — Treyz Law Group, P.C.; G. Victor Treyz; Zachary D. Hadd

(57) ABSTRACT

An organic light-emitting diode display may have thin-film transistor circuitry formed on a substrate. A pixel definition layer may be formed on the thin-film transistor circuitry. Openings in the pixel definition layer may be provided with emissive material overlapping split anodes that are separated by anode gaps. The anode gaps may extend vertically and horizontally or may extend diagonally. The pixel definition layer openings may have edges that extend vertically and horizontally or that extend diagonally. A display may have three different pixel colors or may have four different pixel colors. Each pixel definition layer opening may have a pair of split anodes that are overlapped by a common layer of emissive material or may have four split anodes that are overlapped by a common layer of emissive material.

23 Claims, 13 Drawing Sheets

US 9,490,446 B2

ORGANIC LIGHT-EMITTING DIODE DISPLAY WITH SPLIT ANODES

This application claims the benefit of provisional patent application No. 62/012,907 filed Jun. 16, 2014, which is hereby incorporated by reference herein in its entirety.

BACKGROUND

This relates generally to displays, and more particularly, to organic light-emitting diode displays.

Electronic devices often include displays. Organic light-emitting diode displays may exhibit desirable attributes such as a wide field of view, compact size, and low power consumption. Some organic light-emitting diodes use a tandem design in which a color filer array is used to impart colors to an array of white organic light-emitting diodes. Displays with this type of design experience light losses as white light from the light-emitting diodes passes through the color filter elements of the color filter array.

Organic light-emitting diode displays with individually colored light-emitting diodes (e.g. red, green, and blue diodes) may offer improved efficiency. To form displays such as these, organic emissive material (e.g., red, green, and blue emissive layers) may be evaporated onto a display substrate through a shadow mask. A dielectric pixel definition layer is formed over a thin-film transistor layer on the display substrate. The pixel definition layer has an array of openings that overlap anodes for the light-emitting diodes. The organic emissive materials are evaporated into openings in the pixel definition layer. At higher display resolutions, the portions of the pixel definition layer that surround the openings consume increasing amounts of surface area relative to the anodes. This limits the aperture ratio of the pixels and thereby limits display performance.

It would therefore be desirable to be able to provide improved displays such as improved organic light-emitting diode displays.

SUMMARY

An electronic device may include a display having an array of organic light-emitting diode display pixels. The display may have a display substrate and thin-film transistor circuitry formed on the substrate.

A pixel definition layer may be formed on the thin-film transistor circuitry. Openings in the pixel definition layer may be provided with emissive material that overlaps split anodes. The split anodes are separated by anode gaps.

Anode gaps may extend vertically and horizontally or may extend diagonally across the display. The pixel definition layer openings may have edges that extend vertically and horizontally or that extend diagonally.

A display may have three different pixel colors. For example, a display may have red, green, and blue pixels. A display may also have four different pixel colors (e.g., light blue, dark blue, red, and green). Some of the pixel colors may have split anodes and other pixel colors may have anodes that are not split.

Each pixel definition layer opening that is associated with split anodes may have a pair of split anodes that are overlapped by a common layer of emissive material or may have four split anodes that are overlapped by a common layer of emissive material. The split anodes are independently controlled by independent pixel circuits in the thin-film transistor circuitry.

DETAILED DESCRIPTION

Figure 1:
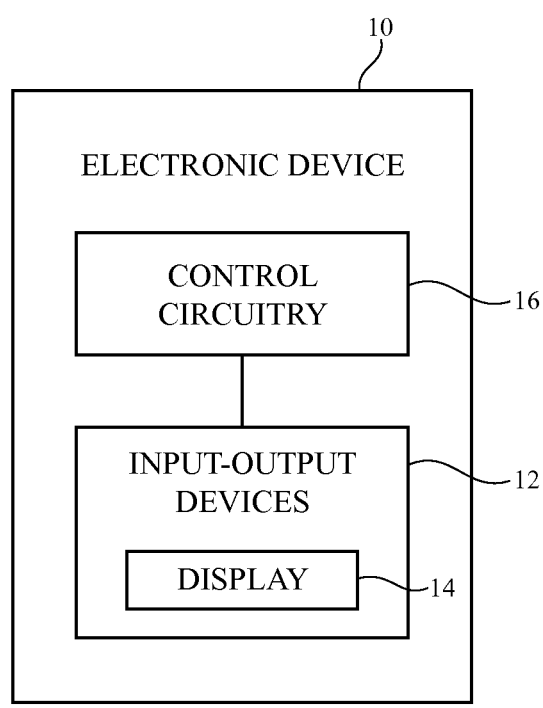
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones speakers, tone generators, vibrators cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Figure 2:
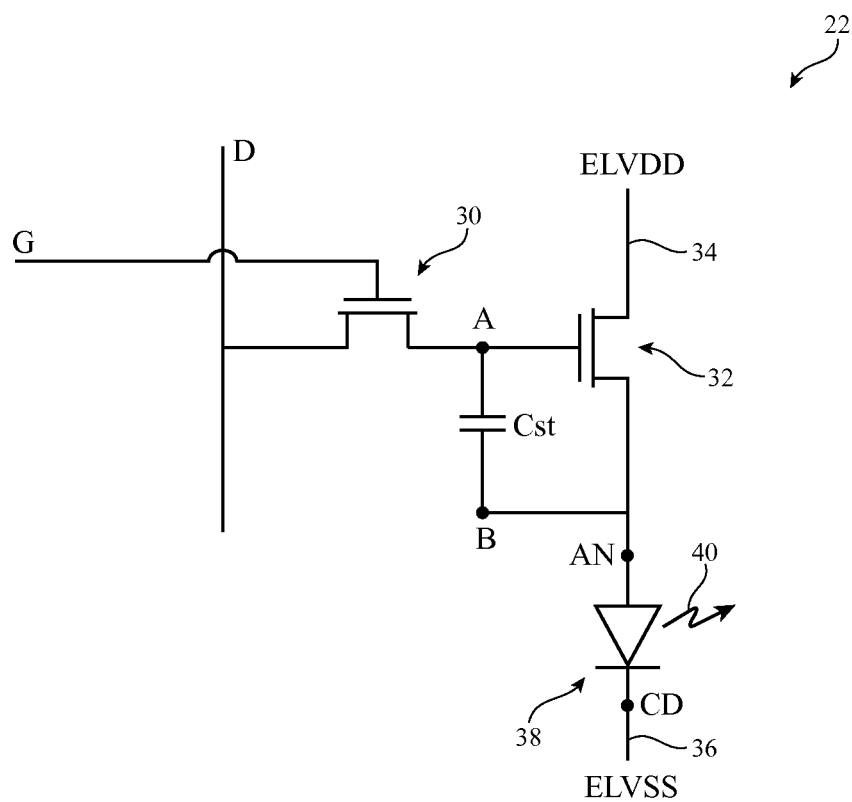
FIG. 2 is a diagram of an illustrative organic light-emitting diode pixel circuit in accordance with an embodiment.

Display 14 may be an organic light-emitting diode display. In an organic light-emitting diode display, each display pixel contains a respective organic light-emitting diode. A schematic diagram of an illustrative pixel circuit for an organic light-emitting diode display pixel is shown in FIG. 2. As shown in FIG. 2, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 front display pixel 22. Cathode CD of diode 38 is coupled to ground terminal 36, so cathode terminal CD of diode 38 may sometimes be referred to as the ground terminal for diode 38. Cathode CD may be shared among multiple diodes (i.e., the cathodes CD of multiple diodes may be tied to a shared voltage). The voltage on the anode of each diode is independently controlled to control the amount of light the diode produces for the pixel associated with that diode.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 30. When switching transistor 30 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 2) may be formed using other configurations (e.g., configurations that include circuitry for compensating for threshold voltage variations in drive transistor 32, etc.). The display pixel circuit of FIG. 2 is merely illustrative.

Figure 3:
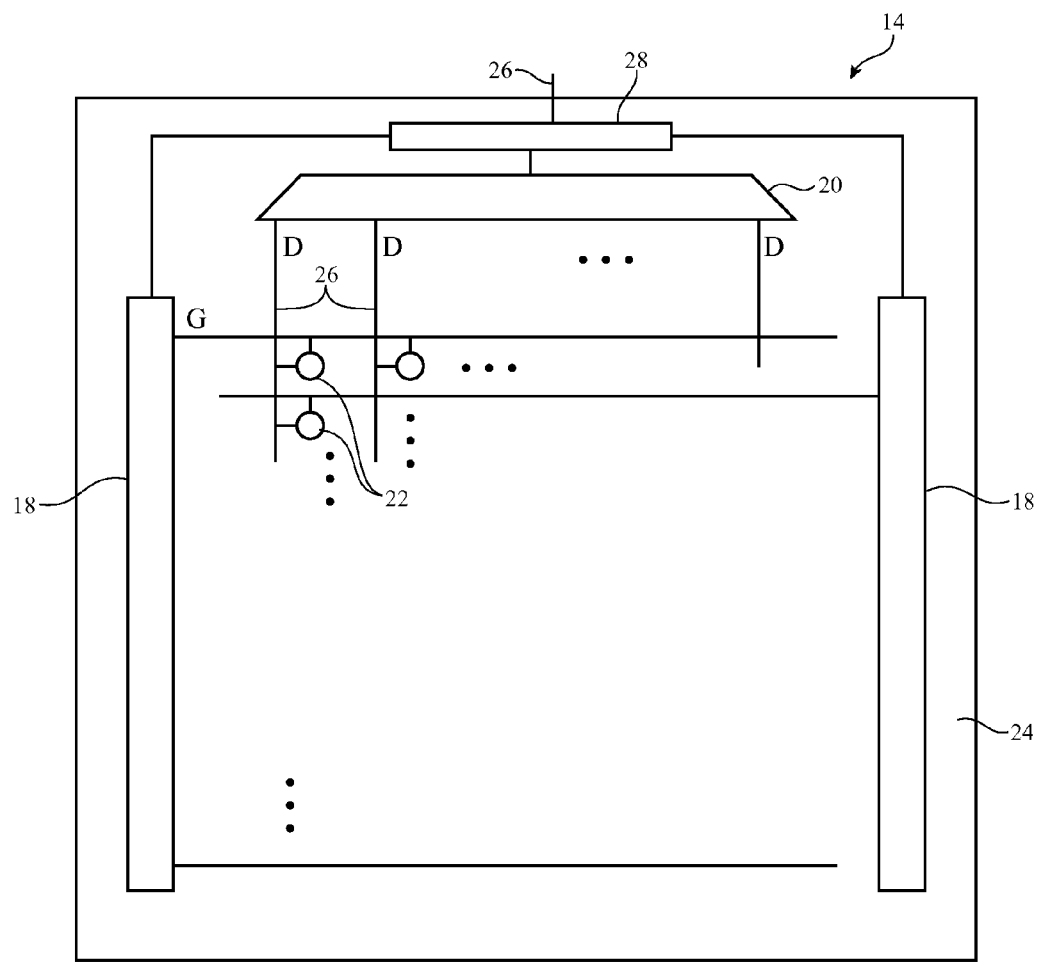
FIG. 3 is a diagram of an illustrative organic light-emitting diode display in accordance with an embodiment.
Figure 3:
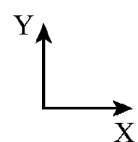

As shown in FIG. 3, display 14 may include layers such as substrate layer 24. Substrate 24 and, if desired, other layers in display 14, may be formed from planar rectangular layers of material such as planar glass layers, planar polymer layers, composite films that include polymer and inorganic materials, metallic foils, etc. Substrate 24 may have left and right vertical edges and upper and lower horizontal edges. If desired, substrate 24 may have non-rectangular shapes (e.g., shapes with curved edges, etc.).

Display 14 may have an array of display pixels 22 for displaying images for a user. Each display pixel may have a light-emitting diode such as organic light-emitting diode 38 of FIG. 2 and associated thin-film transistor circuitry (e.g., the pixel circuit of FIG. 2 or other suitable display pixel circuit). The array of display pixels 22 may be formed from rows and columns of display pixel structures (e.g., display pixels formed from structures on display layers such as substrate 24). There may be any suitable number of rows and columns in the array of display pixels 22 (e.g., ten or more, one hundred or more or one thousand or more). Display 14 may include display pixels 22 of different colors. As an example, display 14 may include red pixels that emit red light, green pixels that emit green light, and blue pixels that emit blue light. Display 14 may also include pixels of four different colors (e.g., light blue, dark blue, red, and green). Configurations for display 14 that include display pixels of other colors may be used, if desired.

Display driver circuitry may be used to control the operation of pixels 22. The display driver circuitry may be formed from integrated circuits, thin-film transistor circuits, or other suitable circuitry. As shown in FIG. 3, display driver integrated circuit 28 (sometimes referred to as a timing controller chip) may contain communications circuitry for communicating with system control circuitry over path 26. Path 26 may be formed from traces on a flexible printed circuit or other cable. The control circuitry may be located on one or more printed circuits in electronic device 10. During operation, the control circuitry (e.g., control circuitry 16 of FIG. 1) may supply circuitry such as display driver integrated circuit 28 with information on images to be displayed on display 14. Circuits such as display driver integrated circuits may be mounted on substrate 24 or may be coupled to substrate 24 through a flexible printed circuit cable or other paths. The circuitry of display driver integrated circuits such as circuit 28 may also be provided using thin-film transistor circuitry on substrate 24.

To display the images on display pixels 22, display driver circuitry 28 may supply corresponding image data to data lines D while issuing clock signals and other control signals to supporting display driver circuitry such as gate driver circuitry 18 and demultiplexing circuitry 20.

Demultiplexer circuitry 20 may be used to demultiplex data signals from circuit 28 onto a plurality of corresponding data lines D. With the illustrative arrangement of FIG. 3, data lines D run vertically through display 14. Data lines D are associated with respective columns of display pixels 22. Demultiplexer circuitry 20 may be implemented as part of an integrated circuit such as circuit 28 and/or may be formed from thin-film transistor circuitry on substrate 24.

Gate driver circuitry 18 (sometimes referred to as scan line driver circuitry) may be implemented as part of an integrated circuit such as circuit 28 and/or may be implemented using thin-film transistor circuitry on substrate 24. Gate lines G (sometimes referred to as scan lines) run horizontally through display 14. Each gate line G is associated with a respective row of display pixels 22. If desired, there may be multiple horizontal control lines such as gate lines G associated with each row of display pixels. Gate driver circuitry 18 may be located on the left side of display 14, on the right side of display 14, or on both the right and left sides of display 14, as shown in FIG. 3.

Gate driver circuitry 18 may assert horizontal control signals (sometimes referred to as scan signals or gate signals) on the gate lines G in display 14. For example, gate driver circuitry 18 may receive clock signals and other control signals from circuit 28 and may, in response to the received signals, assert a gate signal on gate lines G in sequence, starting with the gate line signal G in the first row of display pixels 22. As each gate line is asserted, data from data lines D is located into the corresponding row of display pixels. In this way, control circuitry such as display driver circuitry 28, 20, and 18 may provide display pixels 22 with signals that direct display pixels 22 to generate light for displaying a desired image on display 14. If desired, more complex control schemes may be used to control display pixels using multiple thin-film transistors (e.g., to implement threshold voltage compensation schemes).

Display circuits such as demultiplexer circuitry 20, gate line driver circuitry 18, and the circuitry of display pixels 22 may be formed using thin-film transistors on substrate 24 such as silicon-based transistors such as polysilicon thin-film transistors, semiconducting-oxide-based transistors such as InGaZnO transistors, or other thin-film transistor circuitry.

Figure 4:
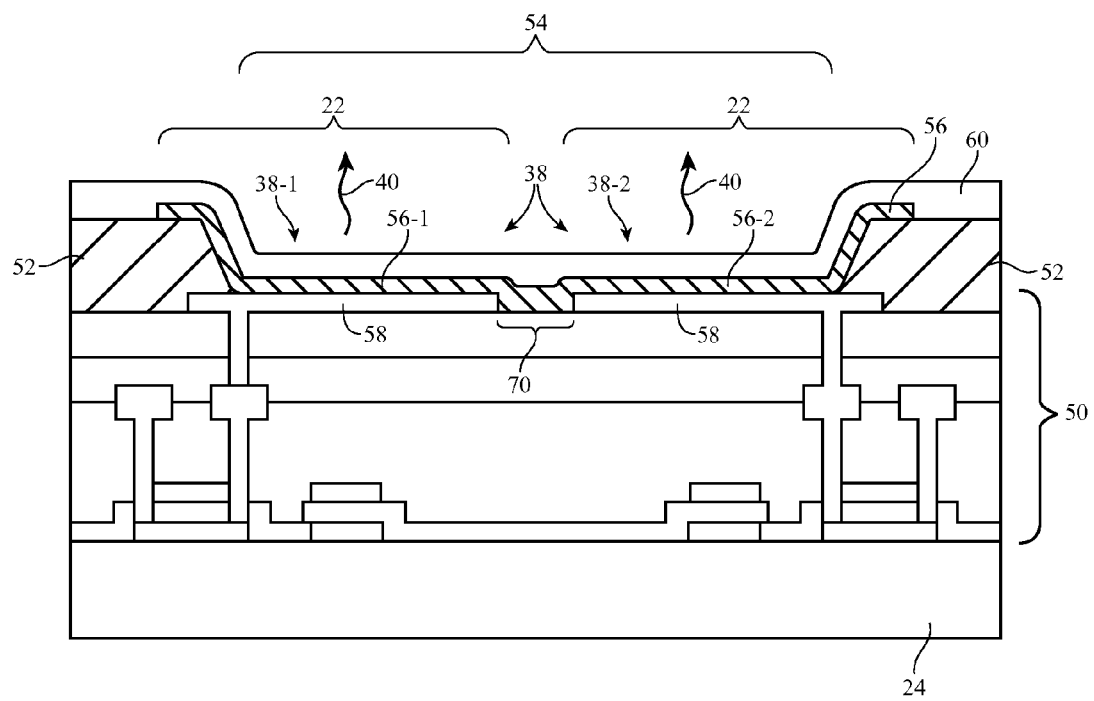
FIG. 4 is a cross-sectional side view of a portion of an illustrative organic light-emitting diode display in accordance with an embodiment.

A cross-sectional side view of a configuration that may be used for the pixels of display 14 of device 10 is shown in FIG. 4. As shown in FIG. 4, display 14 may have a substrate such as substrate 24. Thin-film transistors, capacitors, and other thin-film transistor circuitry 50 (e.g., display pixel circuitry such as the illustrative display pixel circuitry of FIG. 2) may be formed on substrate 24. In the illustrative portion of display 14 that is shown in FIG. 4, two organic light-emitting diodes 38 (e.g., left-hand diode 38-1 and right-hand diode 38-2) have been formed on substrate 24 and provide independently controlled amounts of light 40 for two respective display pixels 22 (e.g., a left-hand display pixel 22 and a right-hand display pixel 22).

Organic light-emitting diodes such as organic light-emitting diodes 38 may be formed from anodes in thin-film transistor circuitry 50 such as anodes 58. Anodes 58 are formed from a commonly deposited conductive layer that is split along anode gap 70 and may therefore sometimes be referred to as split anodes. Anodes 58 may be formed from metal that is photolithographically patterned. The size of anode gap 70 may therefore be relatively small (e.g., 5-12 microns, less than 15 microns, less than 12 microns, less than 10 microns, or more than 4 microns, as examples). The close spacing that is possible between split anodes 58 helps allow display resolution to be enhanced without excessive reductions in pixel aperture ratio.

A blanket cathode layer such as cathode layer 60 may cover all of the display pixels in display 14. Cathode layer 60 may be formed from a transparent conductive material such as indium tin oxide and/or a layer of metal that is sufficiently thin to allow light 40 from diodes 38-1 and 38-2 to pass.

Each diode 38 may have an organic light-emitting emissive layer (sometimes referred to as emissive material or an emissive layer structure). The emissive layer is an electroluminescent organic layer that emits light 40 in response to applied current through each diode 38. A common layer of emissive material such as emissive layer 56 may cover (overlap) both of split anodes 58 and may span anode gaps such as anode gap 70 that lie between the split anodes. The organic emissive material in gap 70 has a high resistance, so diodes 38-1 and 38-2 are electrically isolated from each other and may be operated independently.

As shown in FIG. 4, emissive layer portion 56-1 of layer 56 overlaps the left-hand anode 58 of FIG. 4 and emits light 40 for a left-hand pixel 22 in response to current applied by diode 38-1 between left-hand anode 58 and cathode 60. Emissive layer portion 56-2 of layer 56 overlaps the right-hand anode 58 of FIG. 4 and emits light 40 for a right-hand pixel 22 in response to current applied by diode 38-2 between right-hand anode 58 and cathode 60.

In a color display, emissive layers 56 in the array of pixels in the display include emissive materials of different color. Emissive layer 56 may be deposited on anodes 58 by evaporating layer 56 through a shadow mask (sometimes referred to as a fine metal mask). A slit mask or a spot mask may be used depending on the layout of the pixel colors across the surface of display 14. For example, in configurations in which pixels of the same color are arranged in a horizontally aligned fashion in vertically extending columns, slit masks may be used.

In a display with red, green, and blue pixels, red emissive layers are used for emitting red light in red pixels, green emissive layers are used for emitting green light in green pixels, and blue emissive layers are used for emitting blue light in blue pixels. In a display with four colors such as light blue, blue, green, and red, there are four correspondingly colored emissive layers for emitting light blue light, blue light (sometimes called dark blue light), green light, and red light. Displays with other patterns of colored pixels may have colored emissive layers with correspondingly patterns.

When an emissive layer such as emissive layer 56 of FIG. 4 overlaps multiple split anodes (i.e., a pair of split anodes 58 in the example of FIG. 4 or more than two anodes in other split anode configurations), each of the associated diodes 38 in the set of diodes associated with the split anodes produces light of the same color. For example, if emissive layer 56 of FIG. 4 is a red emissive layer, both left-hand diode 38-1 and right-hand diode 38-2 will produce red light. The amount of light that is produced by each diode can be independently adjusted (i.e., pixels 22 form a pair of independently adjustable red pixels in this example). Diodes of other colors can be formed by evaporating emissive material of different colors onto other anodes in display 14.

In addition to the emissive organic layer in each diode 38, each diode 38 may include additional layers for enhancing diode performance such as an electron injection layer, an electron transport layer, a hole transport layer, and a hole injection layer. Layers such as these may be formed from organic materials (e.g., materials on the upper and lower surfaces of electroluminescent material in layer 56).

Layer 52 (sometimes referred to as a pixel definition layer) has an array of openings such as opening 54 in which emissive material structures such as layer 56 of FIG. 4 are formed and in which anodes 58 for diodes 38 are located. Some pixel definition layer openings may contain split anodes 58, as shown in FIG. 4. Other pixel definition laser openings (e.g., openings for pixels of different colors) may contain only a single anode.

Pixel definition layer 52 may be formed from a photoimageable material that is photolithographically patterned (e.g., dielectric material that can be processed to form photolithographically defined openings such as photoimageable polyimide, photoimageable polyacrylate, other organic photoimageable materials, etc.) or may be formed from material that is deposited through a shadow mask (as examples).

When using a split anode arrangement, openings 54 in pixel definition layer 52 may be sized appropriately to allow two or more pixels to be formed from the two or more split anodes 58 in that opening. For example, each opening 54 may contain two split anodes for two pixels 22, may contain three split anodes for three pixels 22, may contain four split anodes for four pixels 22, may contain two or more split anodes, may contain two to four split anodes, or may form more than four split anodes for more than four pixels 22. The width of gaps such as anode-splitting gap 70 of FIG. 4 may be narrower than the widths of the portions of pixel definition layer 52 between respective openings 54, so the use of split anodes 58 in display 14 may help minimize the fraction of display surface area that is consumed by pixel definition layer 52 and thereby enhance pixel aperture ratios for pixels 22.

Anode-splitting gaps 70 may be formed for each pixel color or for only a subset of pixel colors in display 14. Gaps 70 may extend vertically, horizontally, and/or diagonally.

Figure 5:
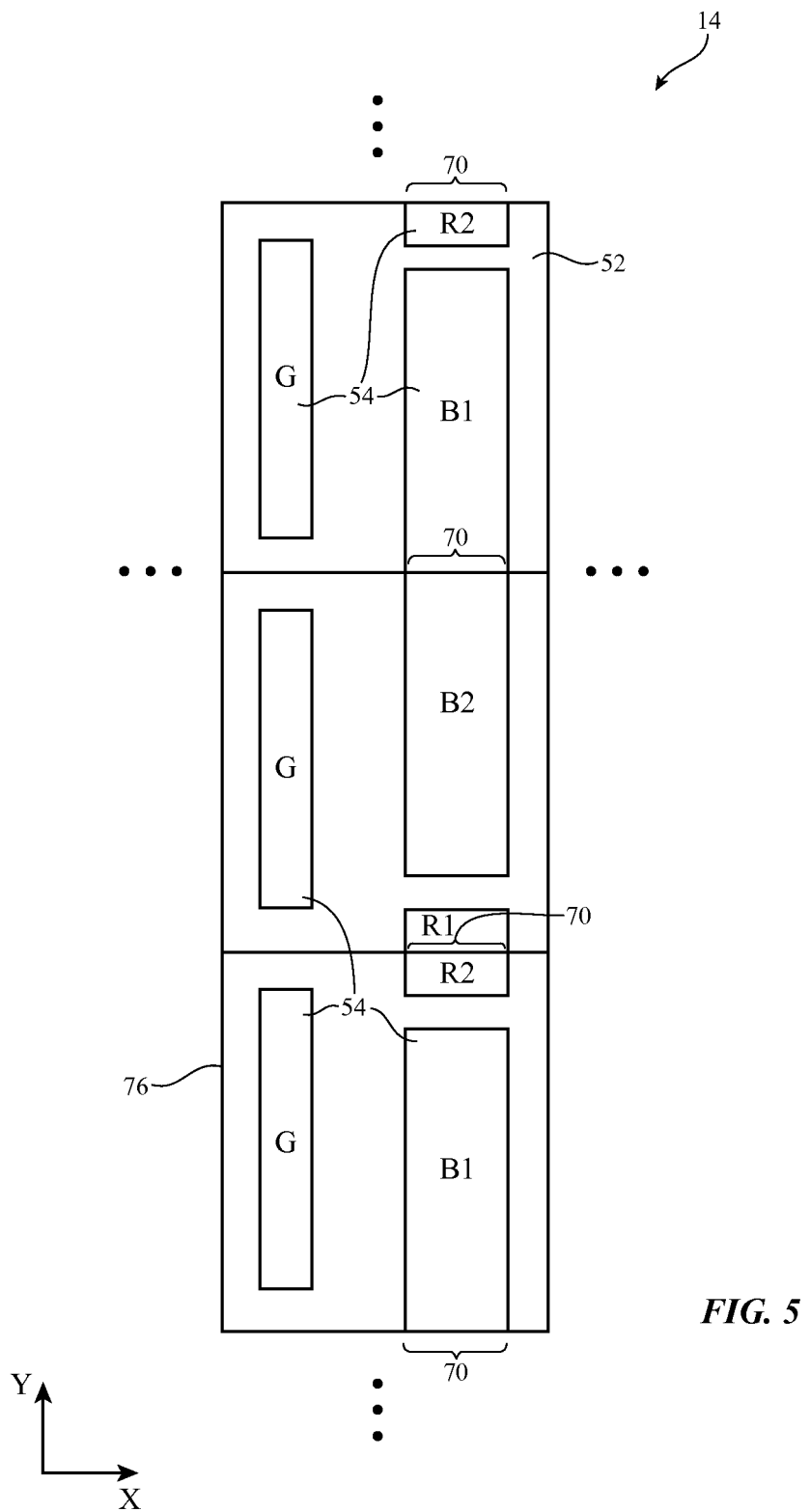
FIG. 5 is a top view of a portion of an illustrative organic light-emitting diode display showing how a pixel definition layer may be patterned to form a column of openings with split anode structures for red and blue pixels in accordance with an embodiment.

Consider, as an example, the illustrative pixel layout of display 14 in FIG. 5. In the example of FIG. 5, pixel definition layer 52 has openings 54 associated with green, red, and blue pixels 22. "Green" pixel definition layer openings 54 are each used for forming a respective green pixel G. "blue" pixel definition layer openings 54 are each used for forming a respective pair of blue pixels B1 and B2, and "red" pixel definition layer openings 54 are each used for forming a respective pair of red pixels R1 and R2. In each blue pixel definition layer opening 54, an anode gap 70 (i.e., a blue anode gap) is used to separate a pair of anodes 58 for respective blue pixels B1 and B2. In each red pixel definition layer opening 54, an anode gap 70 (i.e., a red anode gap) may separate a pair of anodes 58 for respective red pixels R1 and R2. Green pixels G in the arrangement of FIG. 5 do not have split anodes. Each green pixel definition layer opening 54 is associated with a single respective green pixel anode.

The pattern of FIG. 5 (and the patterns of the illustrative displays in the other FIGS.) extends in a tiled fashion across all of display 14. As shown in FIG. 5, green pixels G may be arranged in columns and may be horizontally aligned (i.e., green pixels G in each column may have the same location along horizontal dimension X), facilitating fabrication using a slit mask. Red and blue pixels may be arranged in columns so that pairs of red pixels R1 and R2 alternate with pans of blue pixels B1 and B2. Anode gaps 70 in the FIG. 5 arrangement all extend horizontally (i.e., each gap 70 runs parallel to horizontal axis X).

Figure 6:
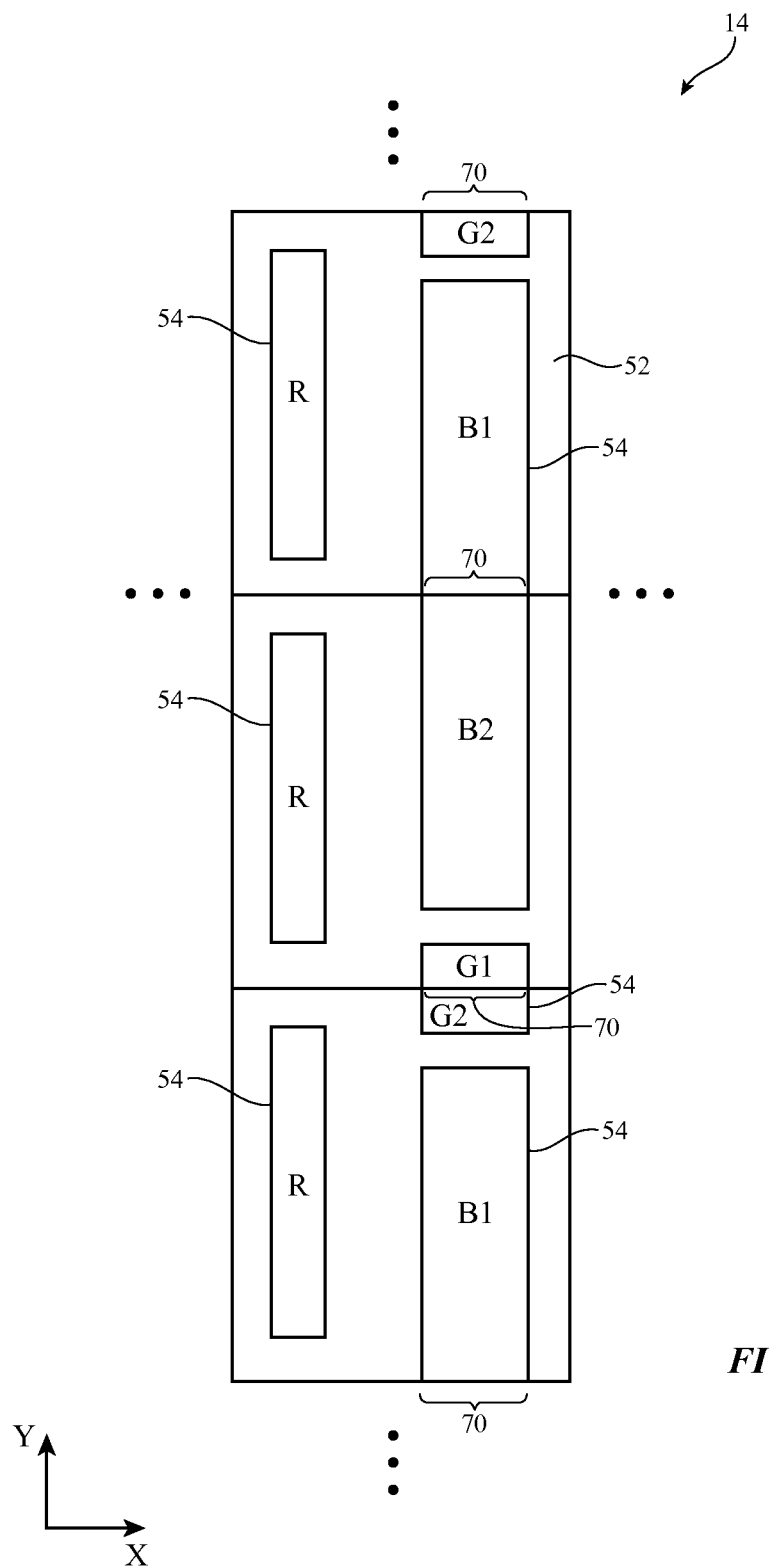
FIG. 6 is a top view of a portion of an illustrative organic light-emitting diode display showing how a pixel definition layer may be patterned to form a column of openings with split anode structures for green and blue pixels in accordance with an embodiment.

In the illustrative configuration of FIG. 6, horizontally extending green anode gaps 70 are used to split the anodes 58 for green pixels G1 and G2 in each green pixel definition layer opening 54 in pixel definition layer 52 and horizontally extending blue anode gaps 70 are used to split the anodes 58 for blue pixels B1 and B2 in each blue pixel definition layer opening 54 in pixel definition layer 52. Red pixels R are horizontally aligned and are arranged in columns running parallel to vertical dimension Y. Red pixels R each have a single anode and do not have split anodes. Blue pixel definition layer openings 54 and green pixel definition layer openings 54 are horizontally aligned and are arranged in columns. In each column, blue pixel pairs B1/B2 alternate with green pixel pairs G1/G2 along vertical dimension Y.

Figure 7:
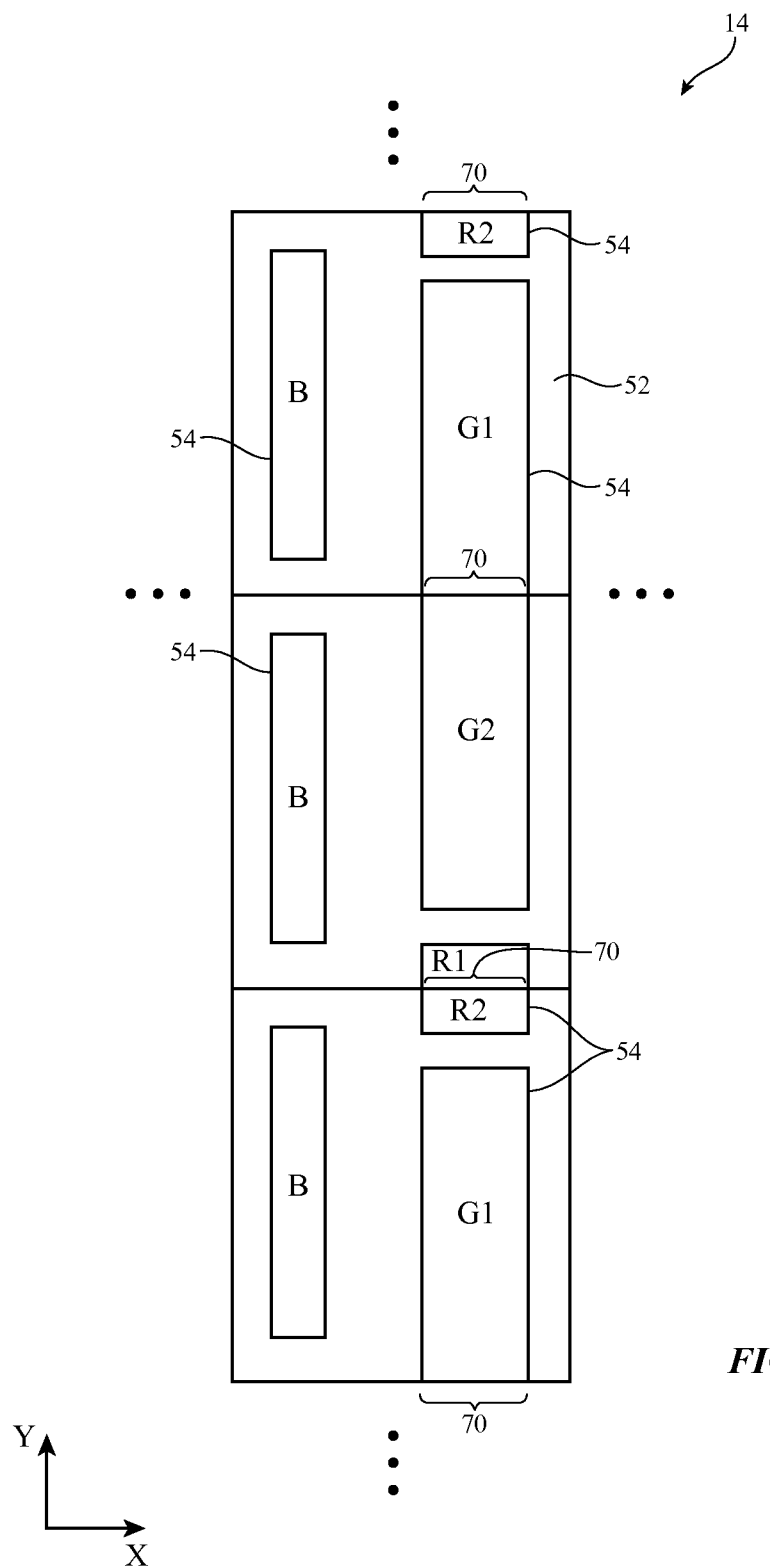
FIG. 7 is a top view of a portion of an illustrative organic light-emitting diode display showing how a pixel definition layer may be patterned to form a column of openings with split anode structures for red and green pixels in accordance with an embodiment.

In the illustrative configuration of FIG. 7. horizontally extending red anode gaps 70 are used to split the anodes 58 for red pixels R1 and R2 in each red pixel definition layer opening 54 in pixel definition layer 52 and horizontally extending green anode gaps 70 are used to split the anodes 58 for green pixels G1 and G2 in each green pixel definition layer opening 54 in pixel definition layer 52. Blue pixels B are horizontally aligned with each other and are arranged in columns running parallel to vertical dimension Y. Blue pixels B each have a single anode and do not have split anodes. Red pixel definition layer openings 54 and green pixel definition layer openings 54 are horizontally aligned and are arranged in columns. In each column, the red and green openings alternate, so that red pixel pairs R1/R2 alternate with green pixel pairs G1/G2 along vertical dimension Y.

Figure 8:
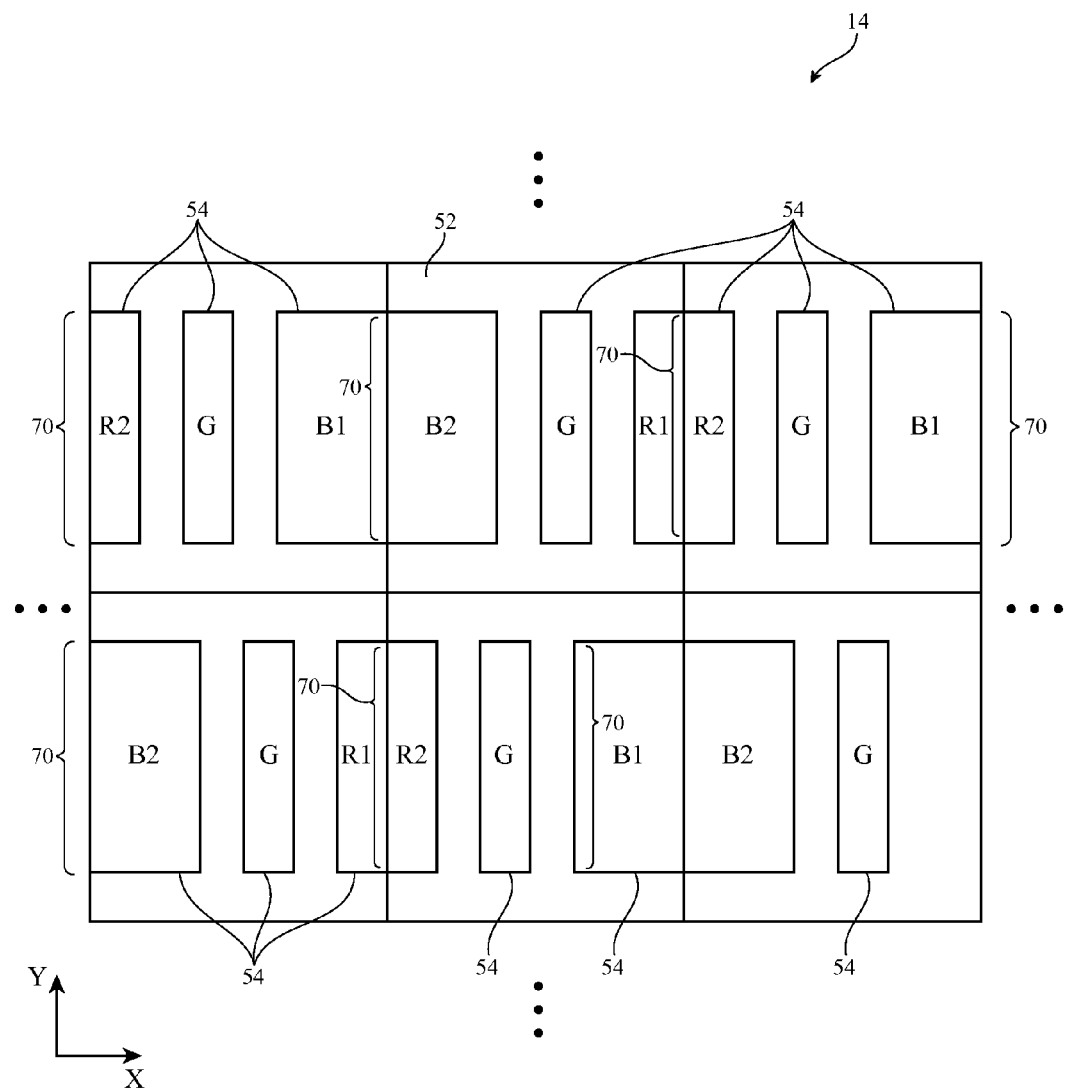
FIG. 8 is a top view of a portion of an illustrative organic light-emitting diode display showing how a pixel definition layer may be patterned to form rows of openings with split anode structures for red and blue pixels in an arrangement with green pixels that are laterally offset from one another in alternating rows in accordance with an embodiment.
Figure 9:
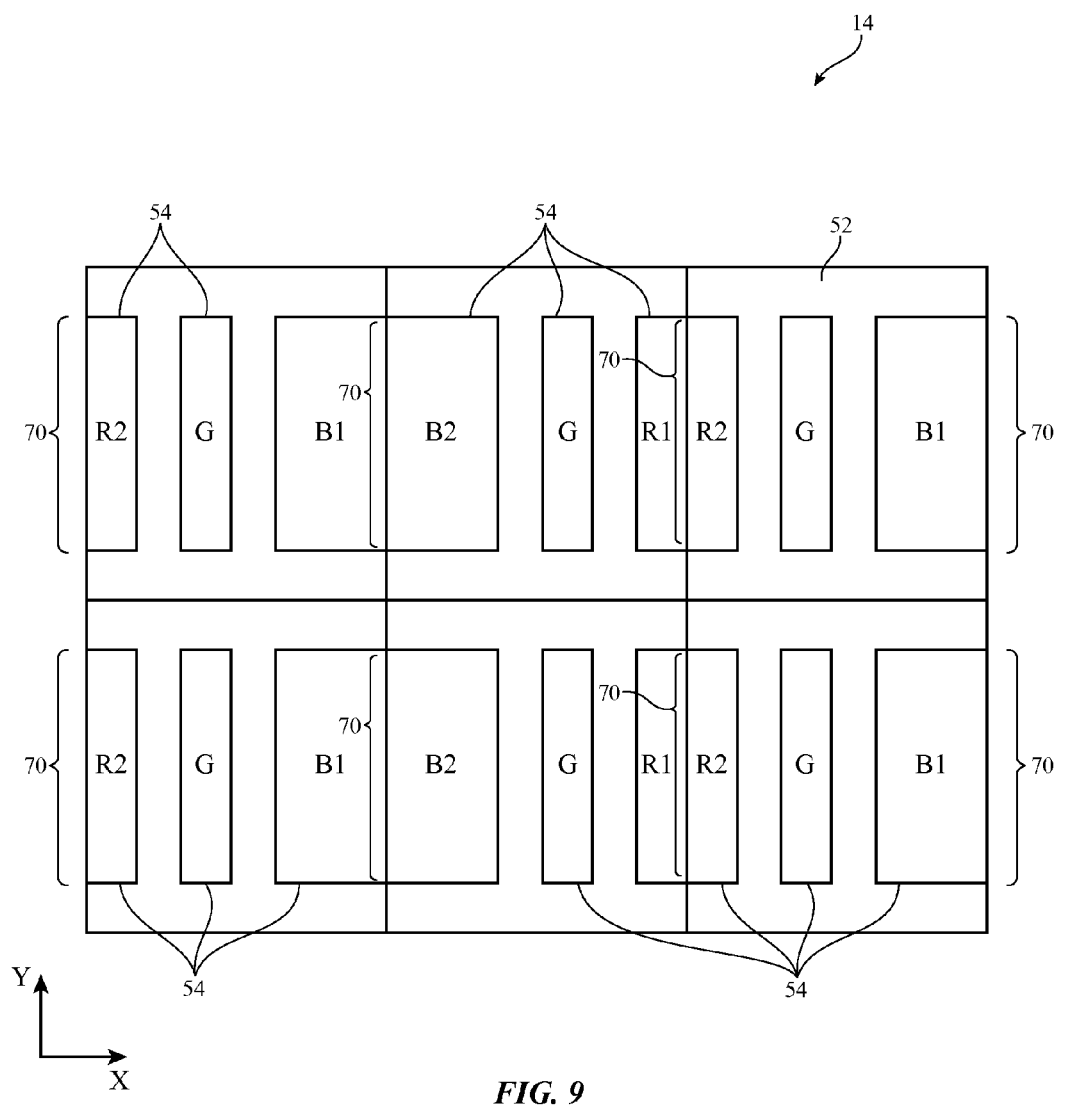
FIG. 9 is a top view of a portion of an illustrative organic light-emitting diode display showing how a pixel definition layer may be patterned to form rows of openings with split anode structures for red and blue pixels in an arrangement with columns of laterally aligned green pixels in accordance with an embodiment.

FIGS. 8 and 9 are illustrative pixel patterns that may be used for a display with vertically extending anode gaps 70.

In the illustrative arrangement of FIG. 8, vertically extending blue anode gaps 70 are used to split the anodes 58 for blue pixels B1 and B2 in each blue pixel definition layer opening 54 in pixel definition layer 52. Vertically extending red anode gaps 70 are used to split the anodes 58 for red pixels R1 and R2 in each red pixel definition layer opening 54 in pixel definition layer 52. Red pixel pairs R1/R1 are horizontally aligned with blue pixel pairs B1/B2 and are arranged in columns in which the red pixel pairs R1/R2 alternate with blue pixel pairs B1/B2. Green pixels G have different horizontal positions in dimension X in alternating rows.

In the illustrative arrangement of FIG. 9, vertically extending blue anode gaps 70 are used to split the anodes 58 for blue pixels B1 and B2 in each blue pixel definition layer opening 54 in pixel definition layer 52. Vertically extending red anode gaps 70 are used to split the anodes 58 for red pixels R1 and R2 in each red pixel definition layer opening 54 in pixel definition layer 52. Red pixel pairs R1/R1 are horizontally aligned and are arranged in columns. Blue pixel pairs B1/B2 and are horizontally aligned and are arranged in columns. Green pixels G, which do not have split anodes, are also horizontally aligned with each other and are arranged in columns. Because each color of pixel is aligned in a respective column, the pattern of FIG. 9 may be formed using a shadow mask with vertically extending slits (sometimes referred to as a slit mask). Spot masks may be used whenever horizontally aligned and vertically extending columns of pixels of the same color are not present in a display.

Figure 10:
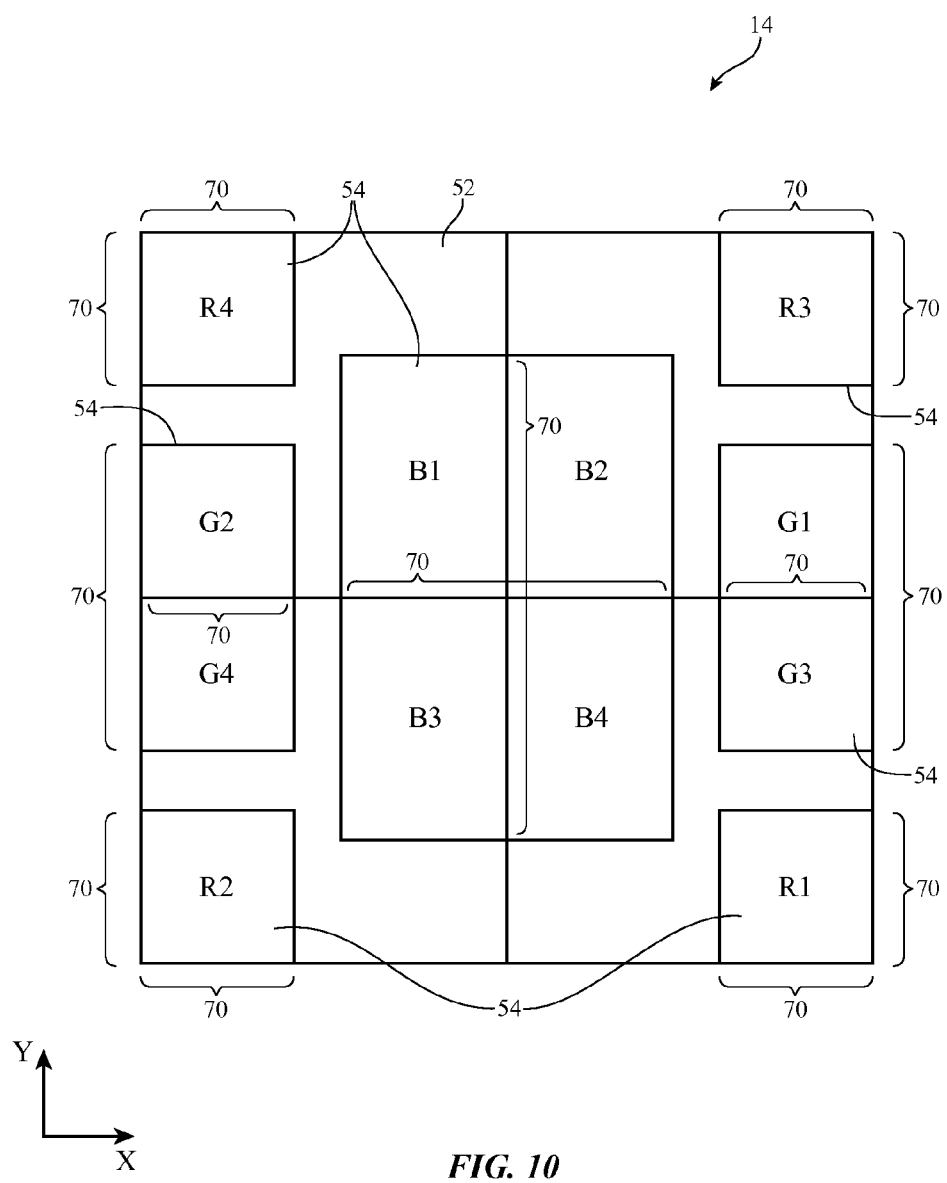
FIG. 10 is a top view of a portion of an illustrative organic light-emitting diode display showing how a pixel definition layer may be patterned to form openings with four split anodes for red, green, and blue pixels in accordance with an embodiment.

FIG. 10 is a top view of an illustrative display in which vertically and horizontally extending blue anode gaps 70 are used to split the anodes 58 in each blue pixel definition layer opening into four blue pixels B1, B2, B3, and B4. Blue pixels extend in columns and may be formed with a slit mask. Vertically and horizontally extending red anode gaps 70 are used to split the anodes 58 in each red pixel definition layer opening into four red pixels R1, R2, R3, and R4. Vertically and horizontally extending green anode gaps 70 are used to split the anodes 58 in each green pixel definition layer opening into four green pixels G1, G2, G3, and G4. The green and red pixels may be formed using spot shadow masks.

Figure 11:
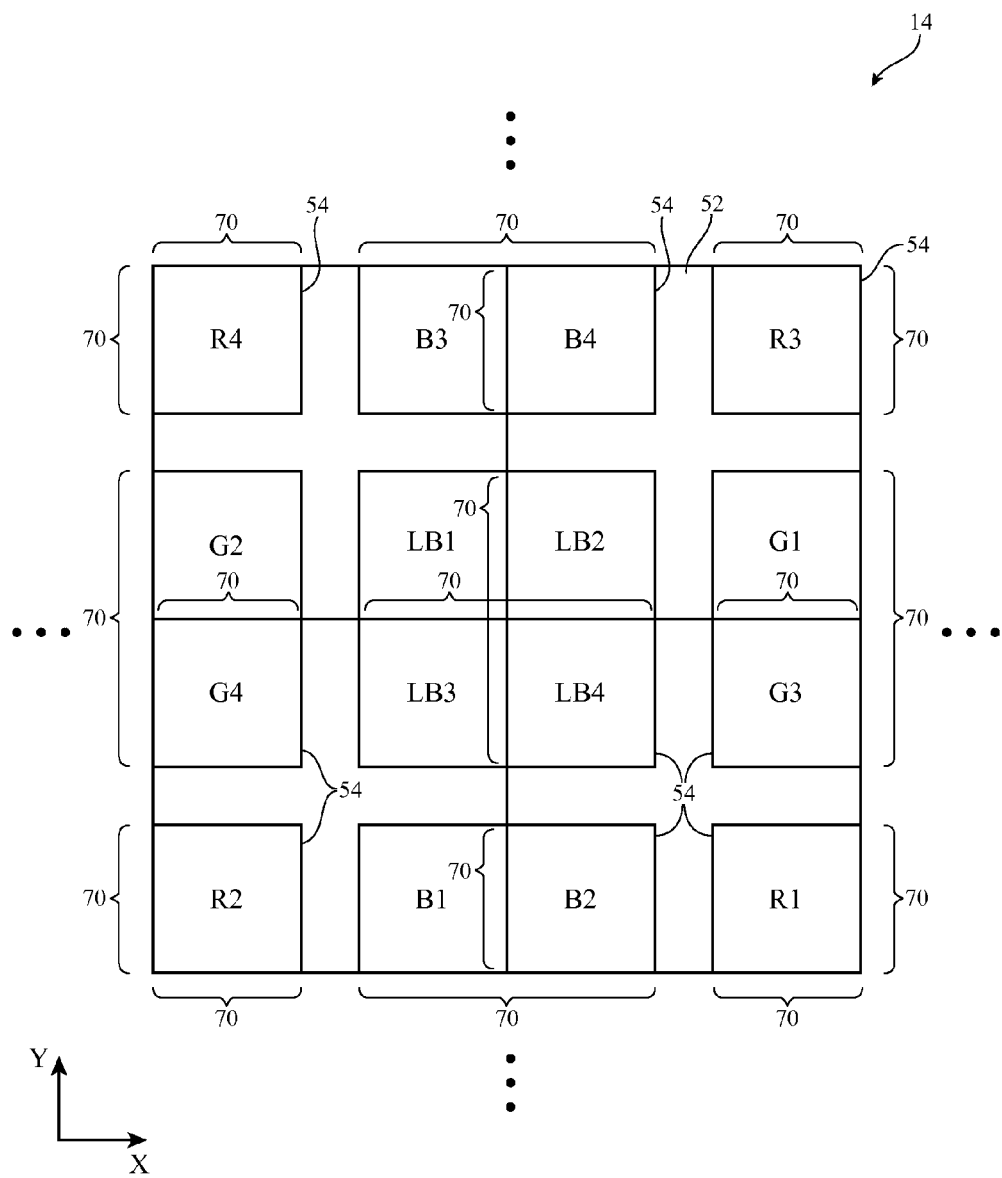
FIG. 11 is a top view of a portion of an illustrative organic light-emitting diode display showing how a pixel definition layer may be patterned to form openings with horizontally and vertically split anode structures for pixels of four different colors in accordance with an embodiment.

If desired, display pixels 40 may have tour colors. As an example, display pixels 40 may include light blue pixels (sometimes referred to as sky blue pixels), dark blue pixels (sometimes referred to as blue pixels), red pixels, and green pixels. The use of these four colors for pixels 22 may allow display 14 to produce light 40 with a desired color gamut. The presence of the light blue pixels may allow display 14 to produce light colors without overly stressing the blue pixels, therefore extending display lifetime. In the illustrative arrangement of FIG. 11, vertically extending and horizontally extending light blue anode gaps 70 are used to split anodes 58 in each light blue pixel definition layer opening into four respective anodes for four respective light blue pixels LB1, LB2, LB3, and LB4. Vertically extending and horizontally extending dark blue anode gaps 70 are used to split anodes 58 in each dark blue pixel definition layer opening into four respective anodes for four respective dark blue pixels B1, B2, B3, and B4. Vertically extending and horizontally extending red anode gaps 70 are used to split anodes 58 in each red pixel definition layer opening into four respective anodes for four respective red pixels R1, R2, R3, and R4. Vertically extending and horizontally extending green anode gaps 70 are also used to split anodes 58 in each green pixel definition layer opening into four respective anodes for four respective green pixels G1, G2, G3, and G4.

Figure 12:
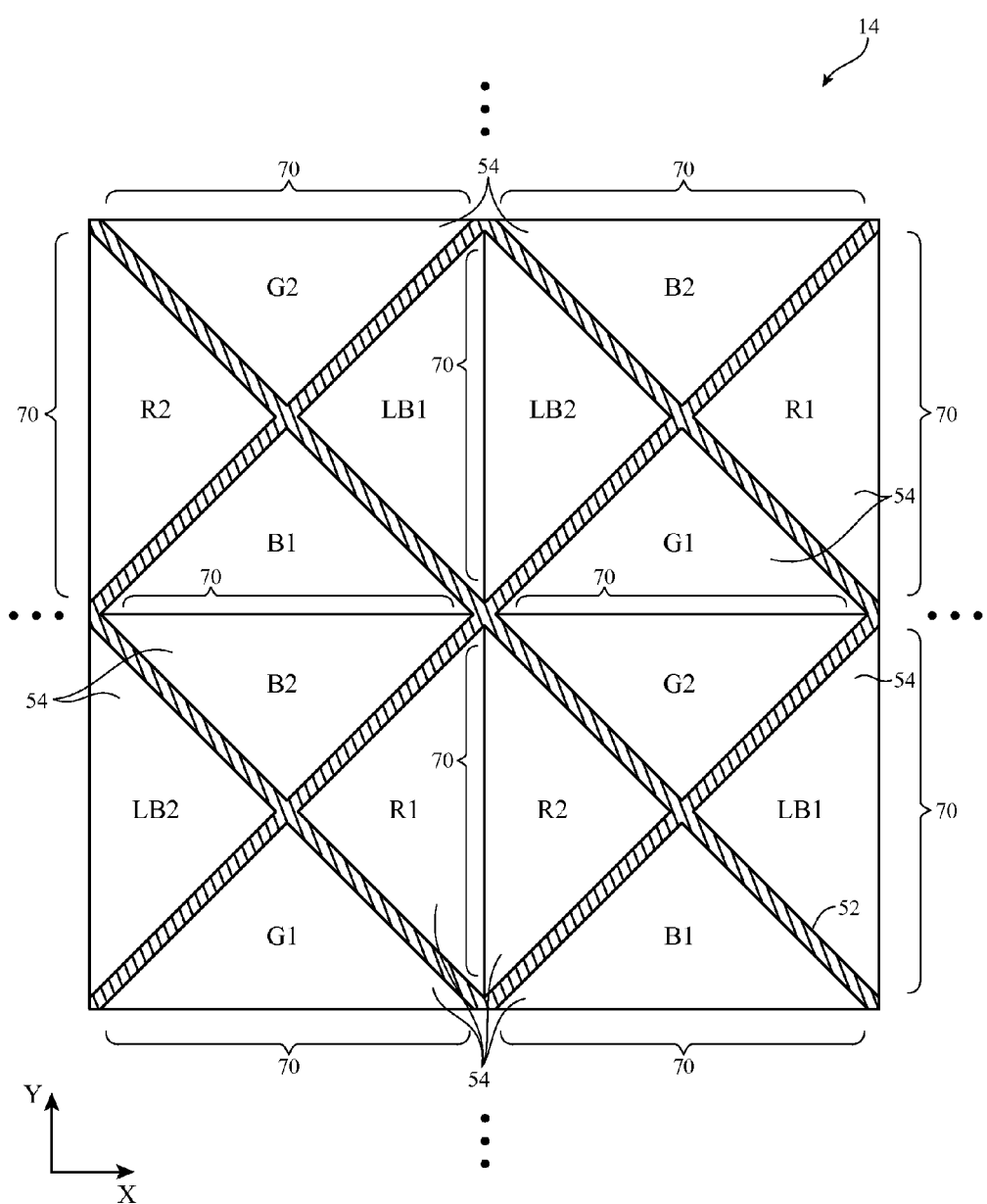
FIG. 12 is a top view of a portion of an illustrative organic light-emitting diode display showing how a pixel definition layer May be patterned to form openings with diagonal edges and split anode structures for pixels of four different colors with in accordance with an embodiment.
Figure 13:
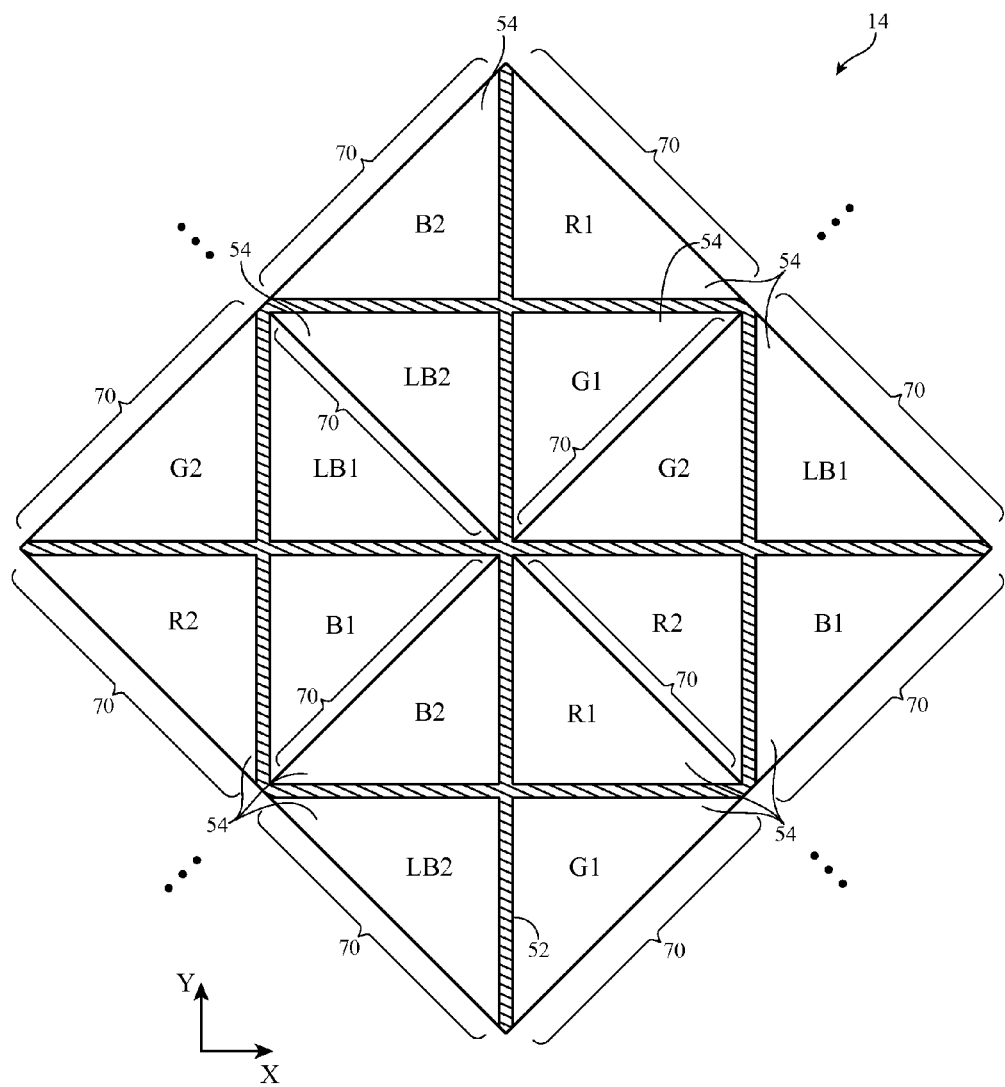
FIG. 13 is a top view of a portion of an illustrative organic light-emitting diode display showing how a pixel definition layer may be patterned to form openings with horizontal and vertical edges and diagonally split anode structures for pixels of four different colors in accordance with an embodiment.

The illustrative configurations of FIGS. 12 and 13 include diagonal structures and can be controlled using display control circuitry that supplies control signals on horizontal, vertical, and/or diagonal signal lines in display 14.

FIG. 12 is a top view of a portion of an illustrative display showing how pixel definition layer 52 may be patterned to form openings 54 with diagonal edges. Each opening may contain two split anodes (for a pair of red pixels R1/R2, a pair of dark blue pixels B1/B2, a pair of light blue pixels LB1, LB2, or a pair of green pixels G1/G2). Anode gaps 70 extend horizontally and vertically.

FIG. 13 is a top view of a portion of an illustrative display in which pixel definition layer 52 has been patterned to form openings 54 with horizontal and vertical edges. Each opening may contain two split anodes (for a pair of red pixels R1/R2, a pair of dark blue pixels B1/B2, a pair of light blue pixels LB1, LB2, or a pair of green pixels G1/G2). Anode gaps 70 of FIG. 13 extend diagonally.

The foregoing is merely illustrative and various modifications can be made by those skilled in the art without departing from the scope and spirit of the described embodiments. The foregoing embodiments may be implemented individually or in any combination.

What is claimed is:

1. An organic light-emitting diode display, comprising:
   a substrate;
   a layer of thin-film transistor circuitry on the substrate; and
   a pixel definition layer on the layer of thin-film transistor circuitry, wherein the pixel definition layer has a first set of openings each of which contains an organic emissive layer for multiple organic light-emitting diodes and has multiple corresponding split anodes, wherein each of the multiple split anodes in each opening in the first set of openings is associated with a respective pixel and is separated from another one of the multiple split anodes in that opening by an anode gap, wherein the pixel definition layer has a second set of openings each of which contains an organic emissive layer for a single organic light-emitting diode and a single anode that is associated with a respective green pixel, and wherein the green pixels do not have split anodes.

2. The organic light-emitting diode display defined in claim 1, wherein the green pixels are horizontally aligned.

3. The organic light-emitting diode display defined in claim 2 wherein the pixels include blue pixels and red pixels, wherein the first set of openings in the pixel definition layer includes blue pixel definition layer openings each of which contains a pair of the split anodes for a pair of blue pixels, and wherein the first set of openings in the pixel definition layer includes red pixel definition layer openings each of which contains a pair of the split anodes for a pair of red pixels.

4. The organic light-emitting diode display defined in claim 3 wherein the blue pixel definition layer openings and the red pixel definition layer openings alternate along a vertical column.

5. The organic light-emitting diode display defined in claim 1, wherein the pixels include horizontally aligned red pixels each of which is formed in a respective red pixel definition layer opening.

6. The organic light-emitting diode display defined in claim 5 wherein the pixels include blue pixels, wherein first set of openings in the pixel definition layer includes blue pixel definition layer openings each of which contains a pair of the split anodes for a pair of blue pixels.

7. The organic light-emitting diode display defined in claim 6 wherein the red pixel definition layer openings and the blue pixel definition layer openings alternate along a vertical column.

8. The organic light-emitting diode display defined in claim 1, wherein the pixels include horizontally aligned blue pixels each of which is formed in a respective blue pixel definition layer opening in the pixel definition layer.

9. The organic light-emitting diode display defined in claim 8 wherein the pixels include red pixels and green pixels, wherein the first set of openings in the pixel definition layer includes red pixel definition layer openings each of which contains a pair of the split anodes for a pair of red pixels.

10. The organic light-emitting diode display defined in claim 9 wherein the red pixel definition layer openings and the green pixel definition layer openings alternate along a vertical column.

11. The organic light-emitting diode display defined in claim 1 wherein the first set of openings in the pixel definition layer includes blue pixel definition layer openings each of which contains a pair of the split anodes for a pair of blue pixels, wherein the anode gap splitting the anodes for the pair of blue pixels in each blue pixel definition layer opening extends vertically.

12. The organic light-emitting diode display defined in claim 11 wherein the first set of openings in the pixel definition layer includes red pixel definition layer openings each of which contains a pair of the split anodes for a pair of red pixels, wherein the anode gap splitting the anodes for the pair of red pixels in each red pixel definition layer opening extends vertically, and wherein the blue pixel definition layer openings and red pixel definition layer openings alternate along a column.

13. The organic light-emitting diode display defined in claim 1 wherein the first set of openings in the pixel definition layer includes include blue pixel definition layer openings each of which contains a pair of the split anodes for a pair of blue pixels, wherein the anode gap splitting the anodes for the pair of blue pixels in each blue pixel definition layer opening extends vertically, wherein the blue pixel definition layer openings extend along columns, wherein the first set of openings in the pixel definition layer includes red pixel definition layer openings each of which contains a pair of the split anodes for a pair of red pixels, wherein the anode gap splitting the anodes for the pair of red pixels in each red pixel definition layer opening extends vertically, wherein the red pixel definition layer openings extend along columns.

14. An organic light-emitting diode display, comprising:
a substrate;
a layer of thin-film transistor circuitry on the substrate; and
a pixel definition layer on the layer of thin-film transistor circuitry, wherein the pixel definition layer has first and second sets of pixel definition layer openings, each of which contains a pair of anodes split along an anode gap, wherein the anodes are coupled to transistors in the layer of thin-film transistor circuitry, wherein each pixel definition layer opening in the first and second sets contains an organic emissive layer that overlaps the pair of anodes and spans the anode gap, wherein the pixel definition layer further comprises a third set of pixel definition layer openings, each of which contains a single anode that is not split and an organic emissive layer that overlaps the single anode, and wherein the organic emissive layer in each of the pixel definition layer opening in the third set is a green organic emissive layer.

15. The organic light-emitting diode display defined in claim 14, wherein the organic emissive layers in the first and second sets of pixel definition layer openings include red, light blue, and dark blue organic emissive layers.

16. A light-emitting diode display, comprising:
a substrate;
a layer of thin-film transistor circuitry on the substrate; and
a pixel definition layer on the layer of thin-film transistor circuitry, wherein the pixel definition layer comprises blue pixel definition layer openings, red pixel definition layer openings, and green pixel definition layer openings, wherein each of the blue pixel definition layer openings contains a blue emissive layer that overlaps a pair of split anodes, wherein each of the red pixel definition layer openings contains a red emissive layer that overlaps a pair of split anodes, and wherein the green pixel definition layer openings do not contain split anodes.

17. The light-emitting diode display defined in claim 16, wherein each of the green pixel definition layer openings contains a green emissive layer that overlaps a single anode.

18. The light-emitting diode display defined in claim 16, wherein the blue pixel definition layer openings are horizontally aligned.

19. The light-emitting diode display defined in claim 16, wherein the red pixel definition layer openings are horizontally aligned.

20. The light-emitting diode display defined in claim 16, wherein the green pixel definition layer openings are horizontally aligned.

21. The organic light-emitting diode display defined in claim 16, wherein the pairs of split anodes in each of the blue pixel definition layer openings and each of the red pixel definition layer openings are separated by a respective horizontally-extending anode gap.

22. The organic light-emitting diode display defined in claim 16, wherein the pairs of split anodes in each of the blue pixel definition layer openings and each of the red pixel definition layer openings are separated by a respective vertically-extending anode gap.

23. The organic light-emitting diode display defined in claim 16, wherein the blue pixel definition layer openings and the red pixel definition layer openings are horizontally aligned and alternate along a vertical column.

* * * * *